United States Patent
Keesler et al.

(10) Patent No.: US 6,451,509 B2
(45) Date of Patent: Sep. 17, 2002

(54) COMPOSITE LAMINATE CIRCUIT STRUCTURE AND METHOD OF FORMING THE SAME

(75) Inventors: Ross W. Keesler, Endicott; Voya R. Markovich; Jim P. Paoletti, both of Endwell; Marybeth Perrino, Apalachin; William E. Wilson, Waverly, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/753,015

(22) Filed: Jan. 2, 2001

Related U.S. Application Data

(62) Division of application No. 09/204,458, filed on Dec. 2, 1998, now Pat. No. 6,175,087.

(51) Int. Cl.[7] .............................. H05K 1/11; H05K 1/14
(52) U.S. Cl. ..................... 430/311; 430/313; 430/317; 427/96; 216/13; 361/704; 174/261; 174/262
(58) Field of Search ........................ 430/311–313, 317; 427/96; 216/13; 361/704; 174/261–262

(56) References Cited

U.S. PATENT DOCUMENTS

| | | | |
|---|---|---|---|
| 4,498,122 A | * 2/1985 | Rainal | 361/414 |
| 4,566,186 A | 1/1986 | Bauer et al. | 29/852 |
| 4,720,322 A | 1/1988 | Tiffin | 216/17 |
| 4,756,930 A | 7/1988 | Kukanskis et al. | 427/97 |
| 4,816,115 A | 3/1989 | Hörner et al. | 438/623 |
| 4,902,610 A | 2/1990 | Shipley | 430/312 |
| 4,915,983 A | 4/1990 | Lake et al. | 427/98 |
| 4,978,420 A | 12/1990 | Bach | 438/624 |
| 4,999,740 A | 3/1991 | Ilardi et al. | 361/720 |
| 5,026,624 A | 6/1991 | Day et al. | 430/280.1 |
| 5,108,785 A | 4/1992 | Lincoln et al. | 427/96 |
| 5,137,618 A | 8/1992 | Burnett et al. | 205/125 |
| 5,229,550 A | * 7/1993 | Bindra et al. | 174/262 |
| 5,239,448 A | 8/1993 | Perkins et al. | 361/764 |
| 5,258,094 A | 11/1993 | Furui et al. | 216/20 |
| 5,308,929 A | 5/1994 | Tani et al. | 174/262 |
| 5,334,488 A | 8/1994 | Shipley, Jr. | 430/315 |
| 5,337,487 A | 8/1994 | Kindl et al. | 33/760 |
| 5,391,513 A | 2/1995 | Delgado et al. | 438/600 |
| 5,420,078 A | 5/1995 | Sikora | 438/618 |
| 5,436,062 A | 7/1995 | Schmidt et al. | 428/209 |
| 5,450,290 A | * 9/1995 | Boyko et al. | 361/792 |
| 5,451,291 A | 9/1995 | Park et al. | 438/702 |
| 5,453,403 A | 9/1995 | Meng et al. | 438/734 |
| 5,470,793 A | 11/1995 | Kalnitsky | 438/623 |
| 5,471,091 A | 11/1995 | Pasch et al. | 257/752 |
| 5,483,100 A | 1/1996 | Marrs et al. | 257/700 |
| 5,487,218 A | 1/1996 | Bhatt et al. | 29/852 |
| 5,514,622 A | 5/1996 | Bornstein et al. | 438/628 |

\* cited by examiner

*Primary Examiner*—Mark F. Huff
*Assistant Examiner*—Daborah Chacko-Davis
(74) *Attorney, Agent, or Firm*—William N. Hogg

(57) ABSTRACT

A method forming a composite laminate structure includes providing first and second circuit board element each having circuitry on at least one face thereof and plated through holes. A voltage plane element is provided having at least one voltage plane having opposite faces with layers of partially cured photodielectric material on each face. At least one hole is photopatterned and etched through the voltage plane element but completely isolated from the voltage plane. Each through hole in the voltage plane element is aligned with a plated through hole in each of the circuit board elements to provide a surface on the voltage plane element communicating with the plated through holes. The voltage plane is laminated between the circuit board elements and the photoimageable material on the voltage plane is fully cured. The surfaces of the voltage plane element communicating with the plated through holes in the circuit board elements are plated with a conducting material to establish a connection between the circuitry on the first and second circuit board elements.

10 Claims, 5 Drawing Sheets

COMPOSITE LAMINATE CIRCUIT STRUCTURE AND METHOD OF FORMING THE SAME

This application is a divisional of application Ser. No. 09/204,458, filed Dec. 2, 1998 now U.S. Pat. No. 6,175,087.

BACKGROUND OF THE INVENTION

1. Field of the Invention

This invention relates generally to the formation of laminate circuit structures by photolithographic techniques, and more particularly to a method of forming composite laminate structures which utilizes a multiplicity of preformed circuits having signal and voltage planes and a laminate structure having a ground plane without signal planes.

2. Related Applications

This application is related to application Ser. No. 09/203,956, Filed Dec. 2, 1998 Entitled "Two Signal One Power Plane Circuit Board" and application Ser. No. 09/203,978, Filed Dec. 2, 1998 Entitled "Multi-Voltage Plane, Multi-Signal Plane Circuit Card".

BACKGROUND INFORMATION

A conventional technique of forming a laminate circuit board structures includes forming layers of dielectric material and electrically conducting material to provide multiple layers of circuits and voltage planes. Voltage planes can be either ground plane or power plane, and are sometimes collectively referred to as power planes. In one prior art technique of forming such structure, layers of dielectric material and conducting material successively applied, i.e. the dielectric material is applied and then voltage planes are supplied thereon and if necessary through holes formed by the drilling or etching of through holes or blind vias. This technique relies on each successive step adding additional structure and the circuitry layers are formed individually; i.e., in each step in forming the signal planes the planes are formed after the formation of the prior layer of signal plane and forming the signal plane on formed power planes. This requires precession drilling to form the plated through holes all of which is time consuming, especially where there is a large number of drilled holes required to form plated through holes.

Thus it is desired to provide a relatively inexpensive photolithographic technique of forming a composite laminate structure from individual discrete laminate structures into a composite laminate- structure.

SUMMARY OF THE INVENTION

A method forming a composite laminate structure includes providing first and second circuit board element each having circuitry on at least one face thereof and plated through holes. A voltage plane element is provided having at least one voltage plane having opposite faces with layers of partially cured photodielectric material on each face. At least one hole is photopatterned and etched through the voltage plane element but completely isolated from the voltage plane. Each through hole in the voltage plane element is aligned with a plated through hole in each of the circuit board elements to provide a surface on the voltage plane element communicating with the plated through holes. The voltage plane is laminated between the circuit board elements and the photoimageable material on the voltage plane is fully cured. The surfaces of the voltage plane element communicating with the plated through holes in the circuit board elements are plated with a conducting material to establish a connection between the circuitry on the first and second circuit board elements.

DESCRIPTION OF THE PREFERRED EMBODIMENTS(S)

The present invention provides a technique and resulting structure wherein two or more essentially fully circuitized components can be joined together using one or more power plane components which power plane components are not circuitized when joined, but which are circuitized after joining with the circuitized components, to form a composite laminate structure of multiple levels of voltage planes and signal planes in which the circuitization of the signal plane components is essentially completed before the lamination of the components to form the final structure.

The invention will be described in its preferred embodiment, utilizing components formed according to the teachings of application Ser. No. 09/203,956; filed Dec. 2, 1998; entitled "Two Signal One Power Plane Circuit Board" and which is incorporated herein by reference. It is to be understood, however, that other circuitized components such as those formed according to the teachings of application Ser. No. 09/203956; filed Dec. 2, 1998; entitled "Multi-Voltage Plane, Multi-Signal Plane Circuit Card", also incorporated herein by reference, could also be used as well as components formed by other methods, or combination of circuitized individual components made by these or other techniques could be used. This will become clear as the invention is described in detail hereinafter.

Figure 1:
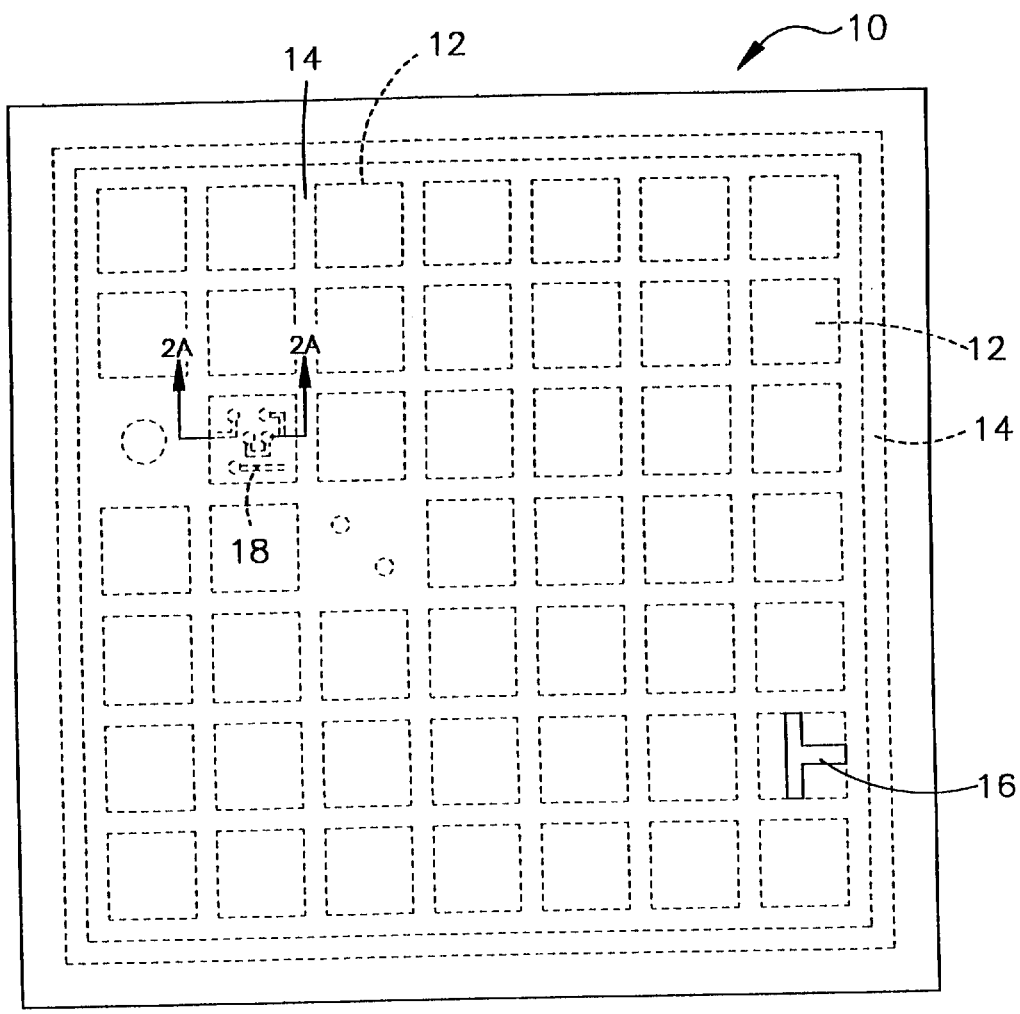
FIG. 1 is a plan view somewhat schematic showing cards or boards which are utilized in the preferred embodiment for two of the components of the composite laminate structure.

Referring now to the drawings and for the present to FIG. 1, a very schematic representation of a panel used to form a plurality of circuit cards or boards, or sections of the cards or boards which form the circuitized components of the composite laminate structure of this invention is shown. As can be seen in FIG. 1, a panel 10 has a plurality of circuit cards or boards designated by the reference character 12 formed thereon, and the various cards or boards 12 are separated by borders 14 which extend completely around each of the cards or boards 12. Borders 16 are also formed that provide an electrical separation within a card. Electrical circuit 18 is formed on both sides of the panel 10. The term "cards" or "circuit cards" is used herein to designate circuitized substrates which can be used as chip carriers or circuit boards or cards for the mounting of chips as well as other electrical components and which themselves become the circuitized components of a composite laminate structure formed from two or more of these "cards" or "circuit cards" laminated to a voltage plane component as will be described presently.

Figure 2:
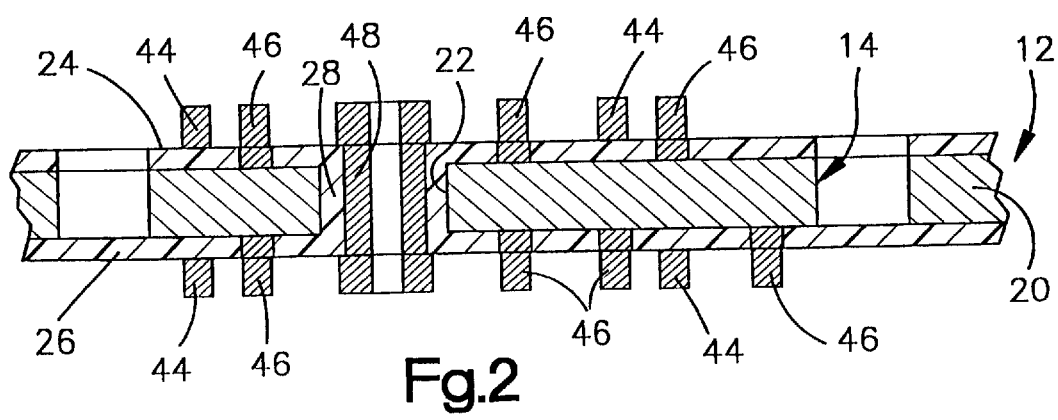
FIG. 2 is a sectional view taken substantially along the plane designated by the line 2—2 of FIG. 1.

FIG. 2, is a sectional view depicting a portion of a structure of a "card" 12 as it is used in a composite structure. The formation of such a panel is described in application Ser. No. 09/203,956; Filed: Dec. 2, 1998; Entitled: "Two Signal One Power Plane Circuit Board". Each card 12 is comprised of a thin copper foil 20 which acts as a voltage plane. As used herein, voltage plane can refer to either a ground plane or a power plane and which voltage planes are sometimes collectively referred to as power planes whether they are ground planes or "voltage planes". The copper foil ground plane 20 has at least one through hole 22 and preferably a plurality of through holes 22 formed therethrough to allow plated through holes to extend from one surface of the part to the other. A first layer photopatternable dielectric material 24 is coated onto one side of the copper foil 20 and a second layer of photoimageable dielectric material 26 is coated on the opposite side of the copper foil 20 and the dielectric material fills in the through holes 22 as shown at 28.

Each layer of dielectric material is preferably between 2 is mils and 4 mils thick. Particularly useful photoimageable material is an epoxy base material of the type described in U.S. Pat. No. 5,026,624 entitled "Composition For Photoimaging" commonly assigned which is incorporated herein by reference. This material 24 and 26 is photoimaged or photopatterned, and developed to reveal the desired pattern and thereafter to provide a dielectric substrate (with through holes) on which metal circuit traces such as plated copper can be formed for the circuit board. The dielectric material may be curtain coated as described in U.S. Pat. No. 5,026,624 and can contain a thixotrope and be screen applied as described in U.S. Pat. No. 5,300,402 or it may be supplied as the dry film. The photoimageable material 24 and 26 is photopatterned developed and fully cured and has thereon circuitry and through holes all as described in said application. Ser. No. 09/203,956. Final cure of the photoimageable material provides a toughened base of dielectric on which electrical circuitry is formed. This circuitry includes circuit traces 44, blind vias 46 extending through the dielectric material 24 or 26 to the copper foil 20, and. plated through holes 48 which extend through both layers of dielectric ,material 24 and 26 as well as through holes 22 formed in the copper foil 20 without contacting the copper foil 20. Borders 14 are also formed as described in said application Ser. No. 09/203,956. It is in this condition that the panel 10 is shown in FIG. 2 herein. Forming of the composite laminate can be done either while the panel 10 is maintained in tact with all of the various cards or boards remaining attached or the various cards can be cut and the lamination procedure described presently performed on the cards individually. The process will be described as practiced by maintaining the panel 10 in tact as a unitary whole.

For ease of description, the process will be described as utilizing two panels 10 identically formed, and joining them together by means of a voltage plane laminate component panel. However, it is to be understood, and as will become apparent in the subsequent description, various different configurations of panels can be joined, it not being required that the panels to be joined are of an identical configuration. Also, the panel can be separated into individual cards or boards and then joined.

As indicated above, two identical panels are used; as the circuit card element and thus for ease of reference, one of the panels will be referred to using the reference characters without a letter suffix and the other one of the two panels being joined will use the reference character followed by the letter "a1" suffix.

Figure 3A:
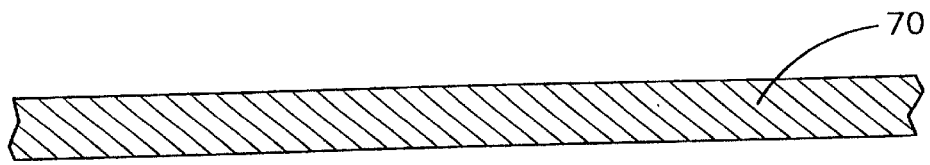
FIGS. 3a through 3c are sectional views somewhat schematic showing the formation of the voltage plane composite structure.
Figure 3B:
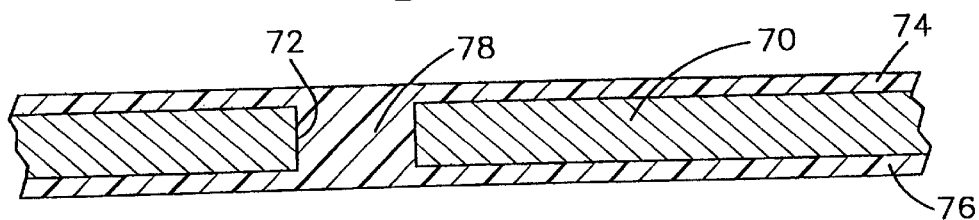
Figure 3C:
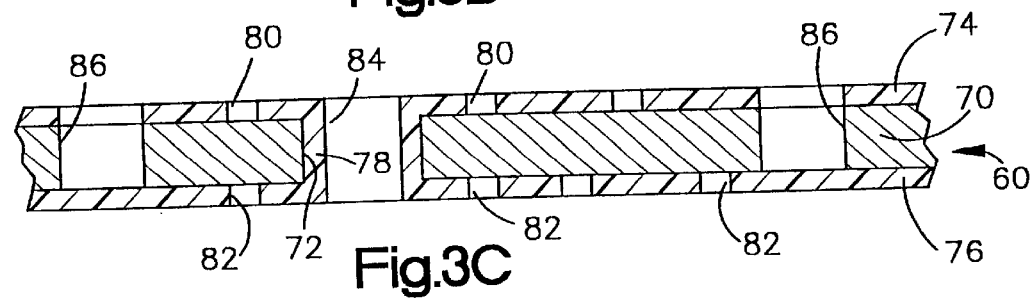

Two panels 10 and 10a having cards 12 and 12a thereon are joined by the use of a voltage plane panel 60, the formation of which is shown in FIGS. 3a–3c. Voltage plane panel 60 is formed by first providing a metal layer 70 which is preferably is a copper foil (either half ounce or one ounce) with one ounce copper being a standard material which is conventionally used. The metal layer preferably should be from about 0.7 mil to about 2.8 mils thick, Just as the copper foil 20 of the panel 10.

Holes which are shown at 72 are formed in the foil 70 by mechanical drilling or by etching. A technique for etching is the use of photolithographic process where the location of each of the holes is patterned and developed in photoresist which is coated onto both sides of the copper foil 70 and the holes etched through the copper by an etchant such as cupric chloride ($CuCL_2$). The photoresist is then stripped. This process is well known in the art.

Briefly this process is as follows: Referring to FIGS. 3a–3c, a first layer of photoimageable dielectric materials 74 is coated onto one side of the copper foil 70 and a second layer of photoimageable dielectric material 76 is coated onto the opposite side of the copper foil 70 and the dielectric materials 74 and 76 fill the throughholes 72 as shown at 78. In this case, the thickness of the photoimageable material 74 and 76 is preferably the same thickness as the layers of the photoimageable dielectric material 24 and 26 of the panel 10; i.e. preferably between about 2 mils and about 4 mils thick. It is required that the photoimageable material 74 and 76 be capable of being partially cured and adherable in its partially cured form to the dielectric material 24 and 26 and the circuitry 44 and 46 and plated through holes 48 of the panels 10 and 10a and thereafter fully cured to accept circuitry.

A particularly useful photoimageable material is an epoxybased material of the type described in U.S. Pat. No. 5,026,624, entitled "Composition for Photoimaging", commonly assigned, which is incorporated herein by reference. As shown in FIG. 2b, this material is photoimaged or photopatterned, developed to reveal the desired pattern, and thereafter cured to provide a dielectric substrate on which metal circuit traces such as plated copper can be formed for forming the circuit board. The dielectric material may be curtain coated as described in said U.S. Pat. No. 5,026,624, or it. can contain a thixotrope and be screen applied as described in U.S. Pat. No. 5,300,402. The material may also be applied as a dry film. A technique for forming a dry film is as follows:

The photoimageable dielectric composition is prepared having a solids content of from about 86.5 to 89%, such solids comprising: about 27.44% PKHC a phenoxy resin; 41.16% of Epirez 5183 a tetrabromobisphenol A; 22.88% - of Epirez SU-8, an octafunctional epoxy bisphenol A formaldehyde novolac resin, 4.85% UVE 1014 photoinitiator; 0.07% ethylviolet dye; 0.03% Fc 430 a fluorinated polyether nonionic surfactant from 3M Company; 3.85% Aerosil 380, an amorphous silicon dioxide from Degussa; to provide the solid content. A solvent was present from about 11 to 13.5% of the total photoimageable dielectric composition. The photoimageable dielectric composition is coated onto a 1.42 mil thick segment of polyethylene terephthalate designated Mylar D a segment of polyethylene terephthalate designated Mylar D a polyester layer from DuPont. The photoimageable dielectric composition is allowed to dry to provide a 2.8 mil thick photoimageable dielectric film on the polyethylene terephthalate backing.

The particular material 74 and 76 as described in said Pat. Nos. 5,026,624 and 5,300,402 is negative acting photodielectric. Hence, those areas which are exposed to actinic radiation, in this case UV light, will not be developed (i.e., will remain) when the material is developed in developer, and areas which are not exposed will be removed, i.e., developed out.

The purpose of the voltage panel plane-component is to provide an additional voltage plane into panels 10 and 10a or cards 12 and 12a to form a composite laminate structure formed of two panels 10a or two cards 12a, a voltage plane panel 60 or voltage plane units 62, the voltage plane panel 60 or voltage plane unit 62 providing an additional voltage plane as well as the structure for laminating panels 10 and 10a together into a single laminate structure which can be later diced into two cards 12 and 12a, which as previously indicated, can be formed from the cards 12 and 12a and a voltage plane unit 62a. To this end, the dielectric materials 74 and 76, and hole filling materials 78 are provided with through holes 84 which allows the circuitry 44a to communicate with a circuitry 44b and blind vias 80 and 82a of the circuitry 44 to 44a to communicate with copper foil 70 to form the additional voltage plane.

To this end, the panel 60 with the photolithographic material 74 and 76 and 78 thereon, are photopatterned and developed to form the necessary openings. The structure shown in FIG. 3b is masked and exposed to UV radiation developed in a conventional way to provide vias 80 in material 74 extending to the foil 70 and vias 82 in material 76 extending to the foil 70. A through hole 84 is also formed passing through the hole 72 with the edges of the through hole 84 spaced from the foil 20. A suitable reagent for developing the epoxy material is propylene carbonate and the exposure is done by exposure to UV light all as described in said application Ser. No. 09/203,956.

At this point in the processing, the photoimageable dielectric material 74, 76 and 78 is B stage cured, i.e. it is cured to a degree which allows the material to flow, in a controlled and reproducable manner to mechanically bond to the opposite faces of the panels 10 and 10a to form a composite structure following which the photoimageable material 74, 76, and 78 will be fully cured as will be described presently.

Also borders 88 are formed around each of the voltage plane units 62, correspond to the borders 14 and 14a around the cards 12 and 12a. These borders are formed only through the photoimageable dielectric material 74 not through the dielectric material 76, and also through the copper foil 70 in a manner similar to that in the formation of the panels 10 and 10a and cards 12 and 12a, so that the integrity will be maintained and the chip is diced The formation of the final composite structure is shown in FIGS. 4a–4f. Since the purpose of the voltage plane units 62 is to provide an electrical connection either between the two cards 12 and 12a or between one of the cards 12 or 12a and the voltage plane defined by the copper foil 70, it is necessary to provide the necessary circuitry in the voltage panel 60 or the various voltage plane units 62. It also is necessary for the voltage plane panel 60 or unit 62 to join the two panels 10 and 10a or two units 12 and 12a together to form a composite structure. Thus as will become apparent presently, the only technique for providing access to the voltage plane panel 60 or unit 62 after laminate is by means of plated through holes 48 in the panels 10 and 10a. Thus, the plated through holes 22 in panels 10 and 10a must align with the panel 60 wherever an electrical connection is to be made to or through each panel 60. Moreover, the diameter of the through holes 84 in the voltage panel 60 must be smaller than the diameter of the plated through holes 48, and the openings 80 and 82 must be smaller in diameter than the inner diameter of the plated through holes 48, also as will become apparent presently.

It is also required that a plated through hole 48 in either panel 10 or 10a must align with an opening 80 or opening 82 respectively in the dielectric 74 or 76 where a connection of the respective panel is to be made to the copper foil 70 defining the voltage plane. Also, a plated through hole 48 in each panel 10 and 10a must align with a through hole 84 in the voltage panel 60.

Figure 4B:
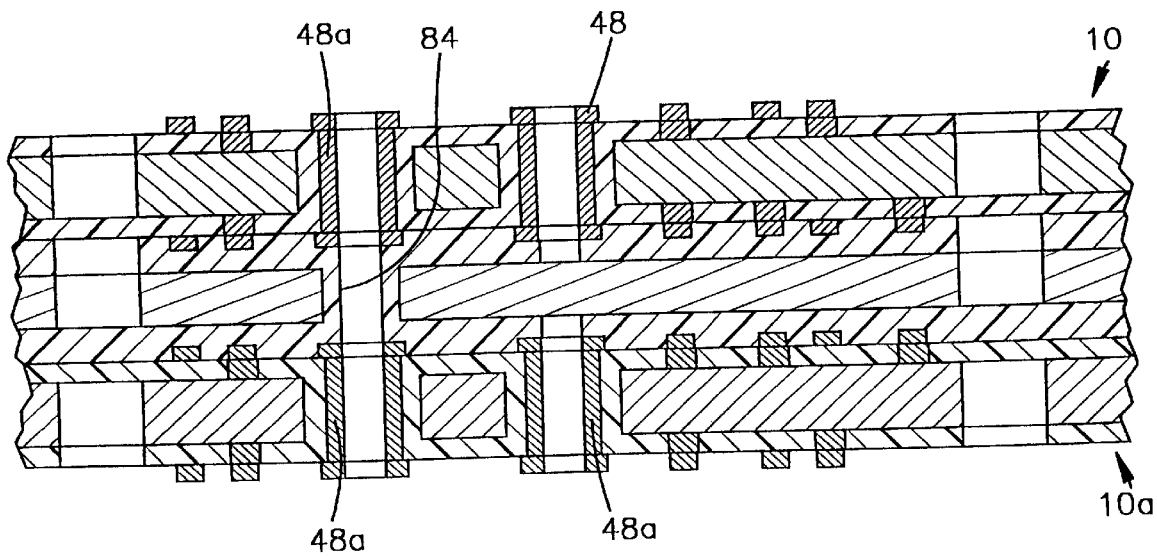
FIGS. 4a through 4f show the sequential. steps in laminating two of the components shown in FIG. 2 with a component in FIG. 3c to form the final composite laminate structure.
Figure 4A:
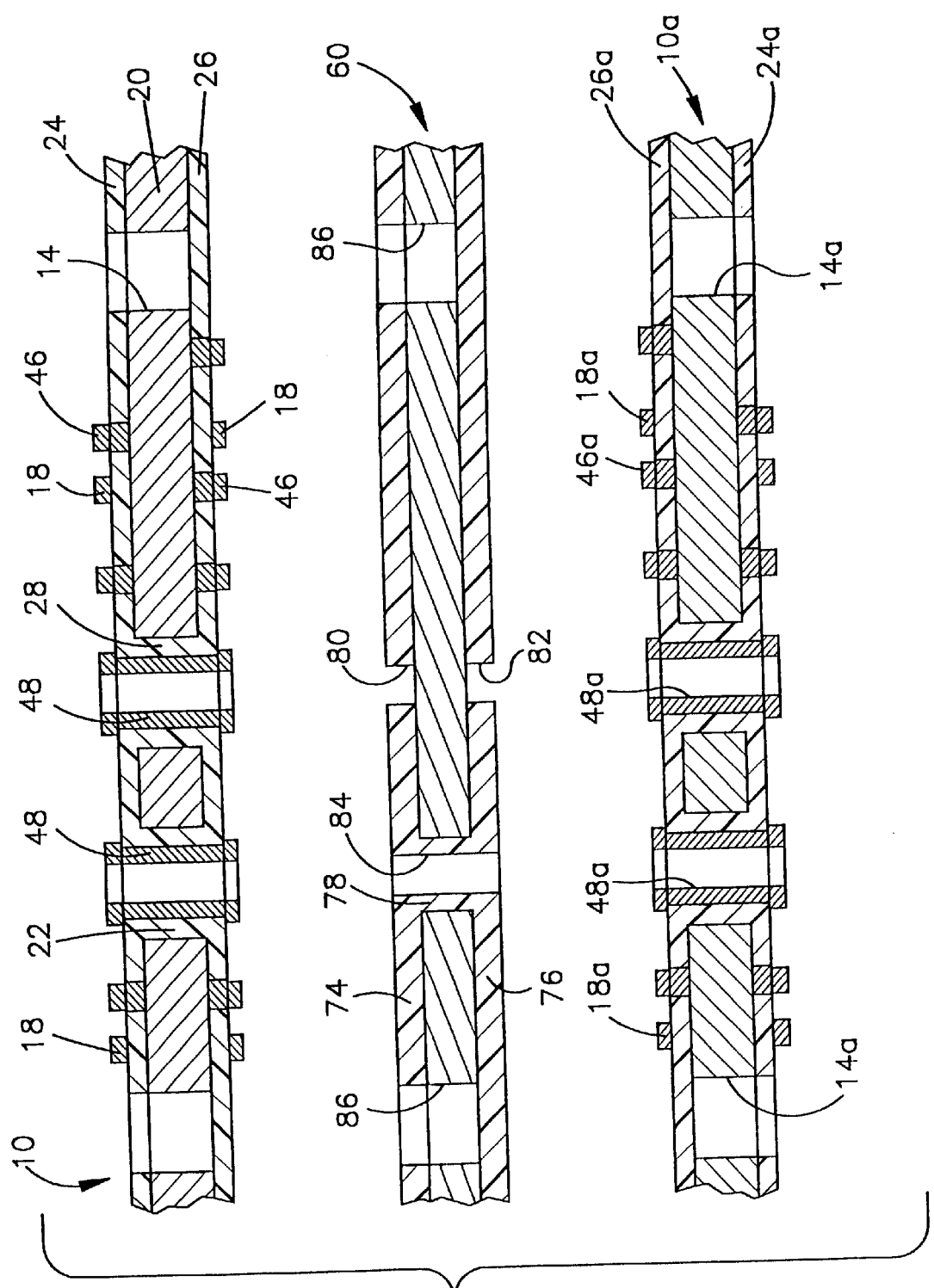

As shown in FIG. 4a portions of panels 10 and 10a are shown positioned and aligned in a stack with a voltage panel 60 all of which are to be joined to form a composite structure. As indicated earlier the dielectric material 74, 76, and 78 of the panel 60 is B-stage cured and therefore is sufficiently tacky to provide an adhesive interface to both the panels 10 and 10a when the dielectric material 24 and 26 on panels 10 and 10a are fully cured. The through holes 48 and 48a aligned either with the openings 80 or 82 or with a through hole 84 as shown in FIG. 4a. The panels 10 and 10a are brought into contact with opposite sides of the voltage panel 60 and the photoimageable dielectric material 74, 76, and 78 are cured to a final cured state. This is preferably done by heating the composite panel structure to a temperature of about 190° C. for about 2 hours at about 500 psi, which will result in a cure of at least about 95 percent and result in the laminate structure of FIG. 4b.

With a composite structure of a pair of panels 10 and 10a laminated to opposite sides of a voltage panel 60 as shown in FIG. 4b, the curing of the dielectric material 74 and 76 provides a suitable surface for the reception of copper plating. To this end, the required interconnections between the panels 10 and 10a and voltage panel 60 are plated by photolithographic techniques.

Figure 4C:
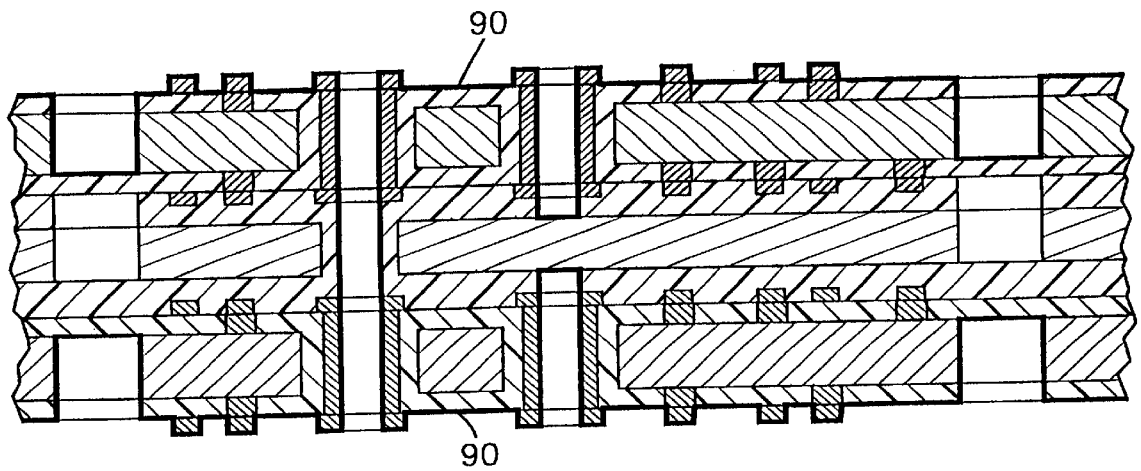
Figure 4D:
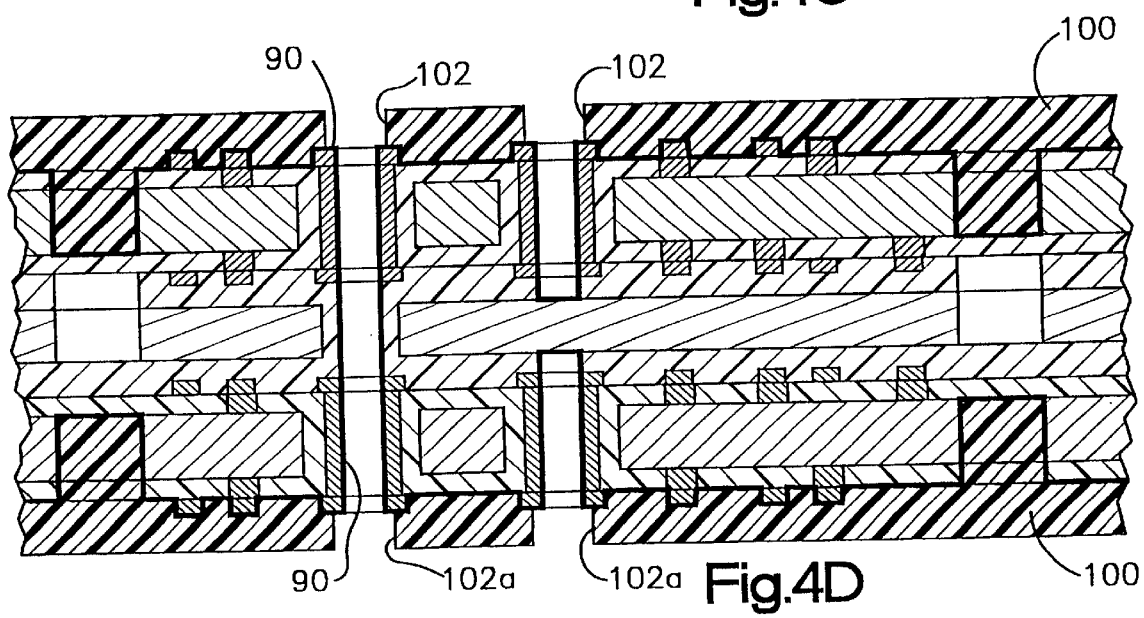

As shown in FIG. 4c, the exposed surfaces of both the panels 10 and 10a and then opened through holes 48 or 48a and rims 106 and 108 are seeded with a layer of palladium, or other seed layer 90 they are coated with photoresist material 100 as shown in FIG. 4d. This can be either a negative acting or positive acting photoresist. The photoresist is patterned and developed as shown in FIG. 4d to provide openings 102 and 102a at all locations aligned with one of the through holes 48 or 48a which are to be utilized for providing the interconnections to or through the panel 60. (It will be remembered that the only path that connections can be made to the panel 60 is through the plated holes 48 and 48a.) The layout thus provides a through hole 84 extending through the voltage panel 60, a rim 106 around the hole 84 where the connection is to be made through the plated through hole 48, and a rim 108 around openings 80 and 82.

Figure 4E:
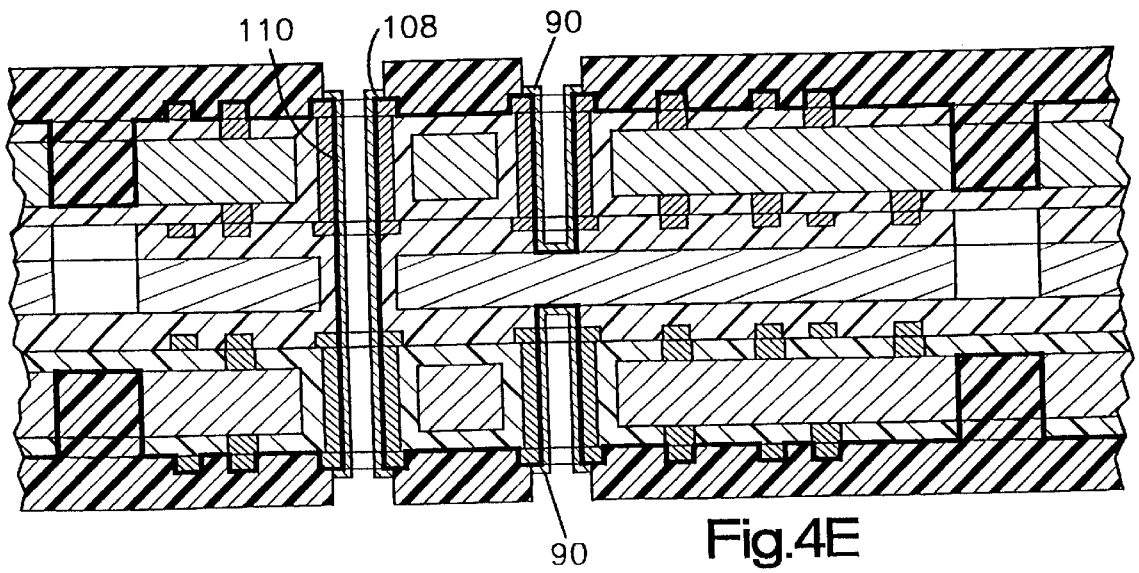

The composite panel is then electroless or electro plated preferably with copper 110 using conventional additive plating techniques to provide the necessary interconnections. The plated structure is shown in FIG. 4e and includes plated connects 112 in hole 84 and plated connects 114 in holes 80 and 82.

Figure 4F:
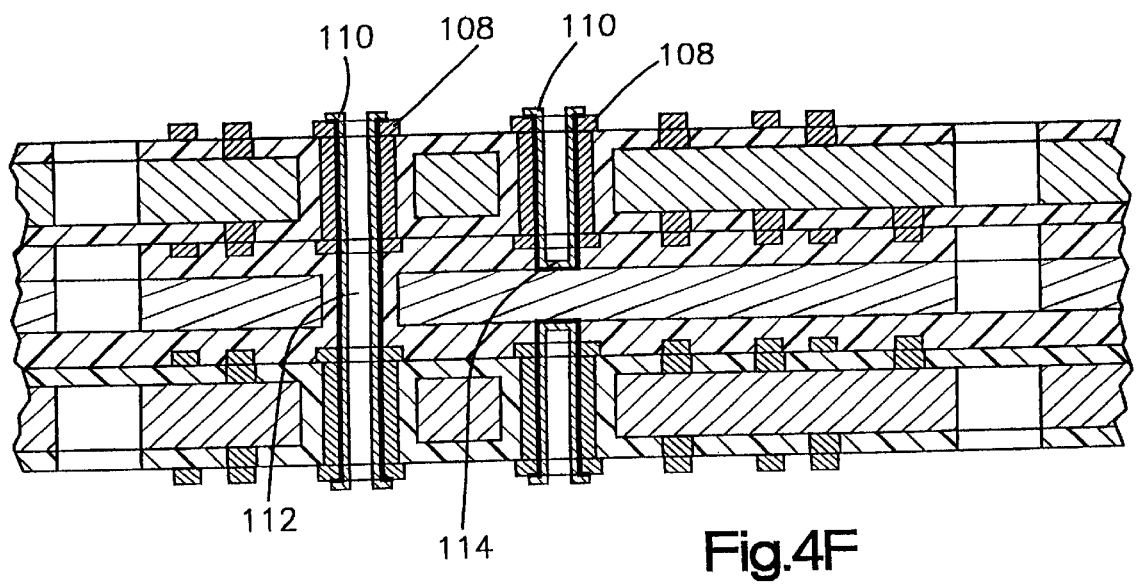

Following this, the photoresist 100 is stripped and the seeding 90 is flash etched to provide the desired composite structure of panels 10 and 10a connected both physically and electrically through a voltage panel 60 as shown in FIG. 4f. The cards are cut from the panel with the composite structure of each card being comprised of a pair of cards 12 and 12a and a voltage plane unit 62.

Figure 5:
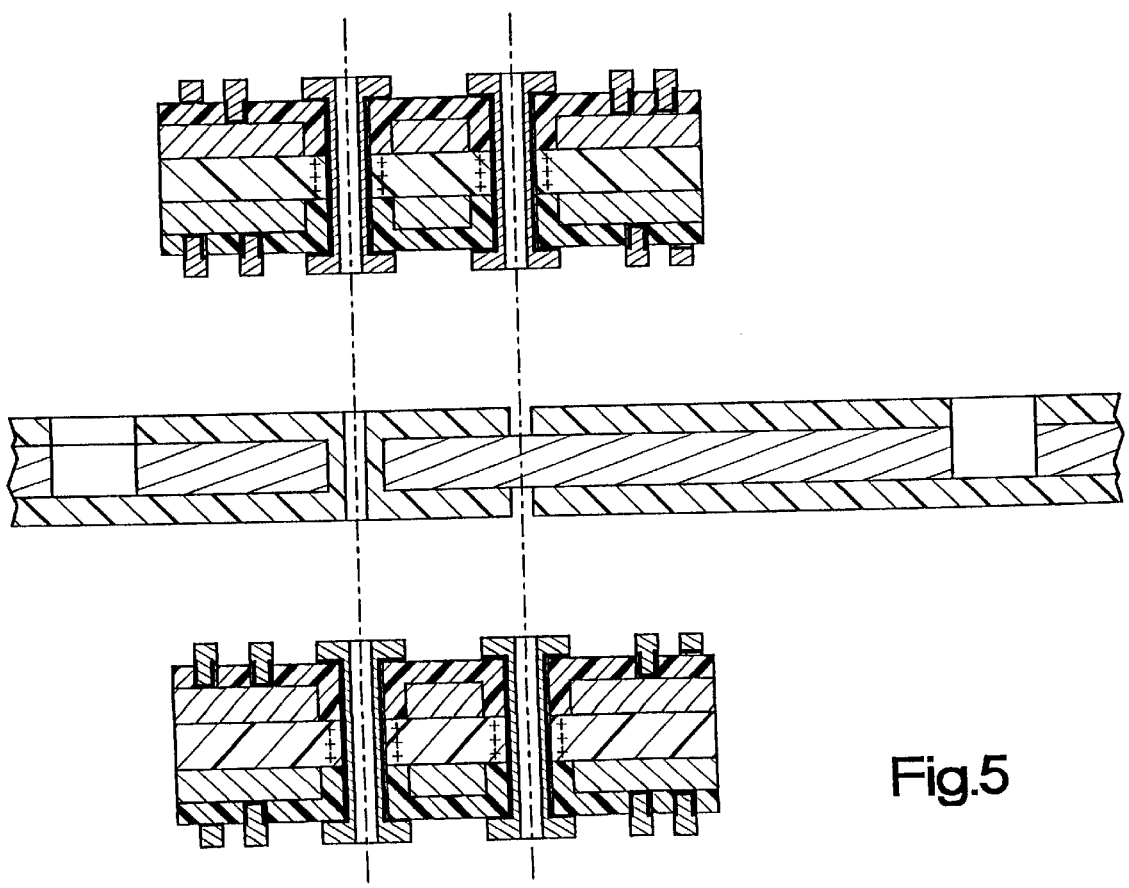
FIG. 5 is a sectional view similar to FIG. 4a of another embodiment of two components to be used with a voltage plane component in the present invention.

As stated earlier, the preferred embodiment utilizes two cards 12 and 12a and a voltage plane unit 62. However, it is to be understood that additional cards 12 or 12a and additional voltage plane units 62 could be utilized to form a composite of three or more cards 12, 12a ... 12n and two or more voltage plane units 62 can also be employed. Also as indicated earlier, cards 12 and 12a need not be identical, but can be predesigned and plated to serve the desired electrical function. Also as noted earlier, the invention is not limited to the technique of forming the cards or boards as shown in application Ser. No. 09/203,956. For example, cards formed with two power planes as described in application Ser. No. 09/203,978, might also be used either in combination with the cards of the application Ser. No. 09/203,956 or with other cards of the same type or with cards of different types. According to the teachings of application Ser. No. 98/203,978 as shown in FIG. 5.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

We claim:

1. A method of forming a composite laminate structure comprising the steps of:

providing first and second circuit board elements, each having city on at least one face thereof and plated through holes, providing a voltage plane element having at least one voltage plane having opposite faces with a layer of partially cured photopatternable dielectric material on each face thereof, photopatterning and etching at least one hole through said voltage plane element and at least one through each layer of photopatternable dielectric material terminating at said voltage plane, thereafter aligning each through hole and each opening in said voltage plane element with a plated through hole in at least one of said circuit board elements to provide surface on said voltage plane element communicating with said plated through holes and with said at least one face of each of said circuit board elements being oriented away from said voltage plane element, thereafter laminating said voltage plane element between said circuit board elements and fully curing said photopatternable dielectric material of said voltage plane element, and thereafter plating the surfaces on said voltage plane element communicating with said plated trough holes in said circuit board elements and said plated through holes in said circuit hoard elements.

2. The invention as defined in claims 1 wherein said circuit board elements are formed at least a part from fully cured photoimageable material.

3. The invention as defined in claim 1 wherein there is circuitry on each face of said circuit board elements.

4. The invention as defined in claim 1 wherein said surfaces are plated using photolithographic technique.

5. The invention as defined in claim 1 wherein the plating is copper plating.

6. The invention as defined in claim 1 wherein said voltage plane element has a single voltage plane.

7. The invention as defined in claim 1 wherein each circuit board element has at least one voltage plane.

8. The invention as defined in claim 7 wherein each circuit board element has plated through holes extending through said at least one voltage plane.

9. The invention as defined in claim 1 wherein at least one circuit board element has a plurality of voltage planes.

10. The invention as defined in claim 1 wherein said photopatterned dielectric material is an epoxy.

* * * * *